United States Patent
Yu et al.

(10) Patent No.: US 9,589,933 B2
(45) Date of Patent: Mar. 7, 2017

(54) METHODS OF PROCESSING WAFER-LEVEL ASSEMBLIES TO REDUCE WARPAGE, AND RELATED ASSEMBLIES

(71) Applicant: Micron Technology, Inc., Boise, ID (US)

(72) Inventors: Aibin Yu, Singapore (SG); Wei Zhou, Singapore (SG); Zhaohui Ma, Singapore (SG); Bret K. Street, Meridian, ID (US)

(73) Assignee: Micron Technology, Inc., Boise, ID (US)

( * ) Notice: Subject to any disclaimer, the term of this patent is extended or adjusted under 35 U.S.C. 154(b) by 126 days.

(21) Appl. No.: 14/312,147

(22) Filed: Jun. 23, 2014

(65) Prior Publication Data
US 2015/0371969 A1    Dec. 24, 2015

(51) Int. Cl.
*H01L 21/78* (2006.01)
*H01L 25/065* (2006.01)

(52) U.S. Cl.
CPC .. *H01L 25/0657* (2013.01); *H01L 2924/0002* (2013.01)

(58) Field of Classification Search
CPC ... H01L 21/78; H01L 21/6836; H01L 23/544; H01L 2924/14
USPC .................................................. 438/458, 464
See application file for complete search history.

(56) References Cited

U.S. PATENT DOCUMENTS

| 8,716,830 B2 * | 5/2014 | Poddar | H01L 24/40 257/522 |
| 8,912,045 B2 * | 12/2014 | Dang | H01L 24/97 438/110 |
| 9,190,390 B2 * | 11/2015 | Gong | H01L 24/19 |

OTHER PUBLICATIONS

Mallik et al., Simulation of Process-Stress Induced Warpage of Silicon Wafers Using ANSYS® Finite Element Analysis, on the World Wide Web at onsemi.com/site/pdf/IMAPS-waferwarpage_aditi_roger.pdf (last visited Apr. 10, 2014).
Nakajima et al., Measurement Methods of Package Warpage at Elevated Temperature and the Maximum Permissible Warpage, on the World Wide Web at akrometrix.com/industrydocs/JEITA_Warpage_Specification_2007.pdf (last visited Apr. 10, 2014).

(Continued)

*Primary Examiner* — Quoc Hoang
(74) *Attorney, Agent, or Firm* — TraskBritt

(57) ABSTRACT

Wafer-level methods of processing semiconductor devices may involve forming grooves partially through a molding material, the molding material located in streets and at least surrounding stacks of semiconductor dice located on a wafer. Wafer-level methods of preparing semiconductor devices may involve attaching a wafer to a carrier substrate and forming stacks of laterally spaced semiconductor dice on die locations of the wafer. Molding material may be disposed over the die stacks on a surface of the wafer to at least surround the stacks of semiconductor dice with the molding material. Grooves may be formed in the molding material by partially cutting through the molding material between at least some of the stacks of semiconductor dice along streets between the die stacks. The resulting wafer-level assembly may then, when exposed to elevated temperatures during, for example, debonding the wafer from a carrier, exhibit reduced propensity for warping.

20 Claims, 6 Drawing Sheets

(56) References Cited

OTHER PUBLICATIONS

Wang et al., Measurement of Thermally Induced Warpage of BGA Packages/Substrates Using Phase-Stepping Shadow Moiré, on the World Wide Web at akrometrix.com/whitepapers/BGA%20Warpage%20 Using%20Phase%20Stepping.pdf (last visited Apr. 10, 2014).

* cited by examiner

METHODS OF PROCESSING WAFER-LEVEL ASSEMBLIES TO REDUCE WARPAGE, AND RELATED ASSEMBLIES

FIELD

This disclosure relates generally semiconductor devices and semiconductor device processing. More specifically, disclosed embodiments relate to methods of processing semiconductor devices at the wafer level, which may reduce warpage of a wafer-level assembly under elevated temperature conditions.

BACKGROUND

In-process semiconductor devices may be formed by physically and electrically attaching semiconductor dice (e.g., stacks of semiconductor dice) to an active surface of a wafer of semiconductor material. The semiconductor dice may be at least laterally surrounded by a molding material. When the wafer-level assembly comprising the in-process semiconductor devices and wafer is exposed to elevated temperatures, for example, during back end processing as well as debonding of the wafer level assembly from a carrier substrate, the wafer-level assembly may warp beyond acceptable tolerances. For example, materials of the molding material, the semiconductor dice, and the wafer may exhibit different coefficients of thermal expansion, such that heating or cooling causes the molding material and semiconductor material of the semiconductor dice and wafer to expand or contract at different rates, resulting in warpage of the wafer-level assembly. When the wafer-level assembly is warped, handling and processing may be difficult, if not impossible, to accomplish without handling and processing equipment damaging the wafer.

Attempts have been made to minimize warpage of wafer-level assemblies comprising molding material through selection of molding materials, as the volume of molding material relative to the total volume of other materials (e.g., silicon and metals) in a wafer-level assembly is a dominant factor. However, existing molding materials have proven to promote warpage to one degree or another in excess of acceptable tolerances under exposure to elevated temperatures. For example, differences in coefficients of thermal expansion between the molding materials and semiconductor wafers may cause warpage of 1 mm, 2 mm, or even greater. As the warpage of the semiconductor wafer increases, the likelihood that the wafer will be damaged during handling and processing, such as during surface grinding, debonding from a carrier substrate, and cutting to singulate individual semiconductor devices from one another, increases.

BRIEF DESCRIPTION OF THE DRAWINGS

While this disclosure concludes with claims particularly pointing out and distinctly claiming specific embodiments, various features and advantages of embodiments within the scope of this disclosure may be more readily ascertained from the following description when read in conjunction with the accompanying drawings, in which:

DETAILED DESCRIPTION

The illustrations presented in this disclosure are not meant to be actual views of any particular apparatus or component thereof, but are merely idealized representations employed to describe illustrative embodiments. Thus, the drawings are not necessarily to scale.

Disclosed embodiments relate generally to apparatuses that may do this inventive thing or include this inventive material or feature. More specifically, disclosed are embodiments of apparatuses that may achieve this inventive result.

Figure 1:
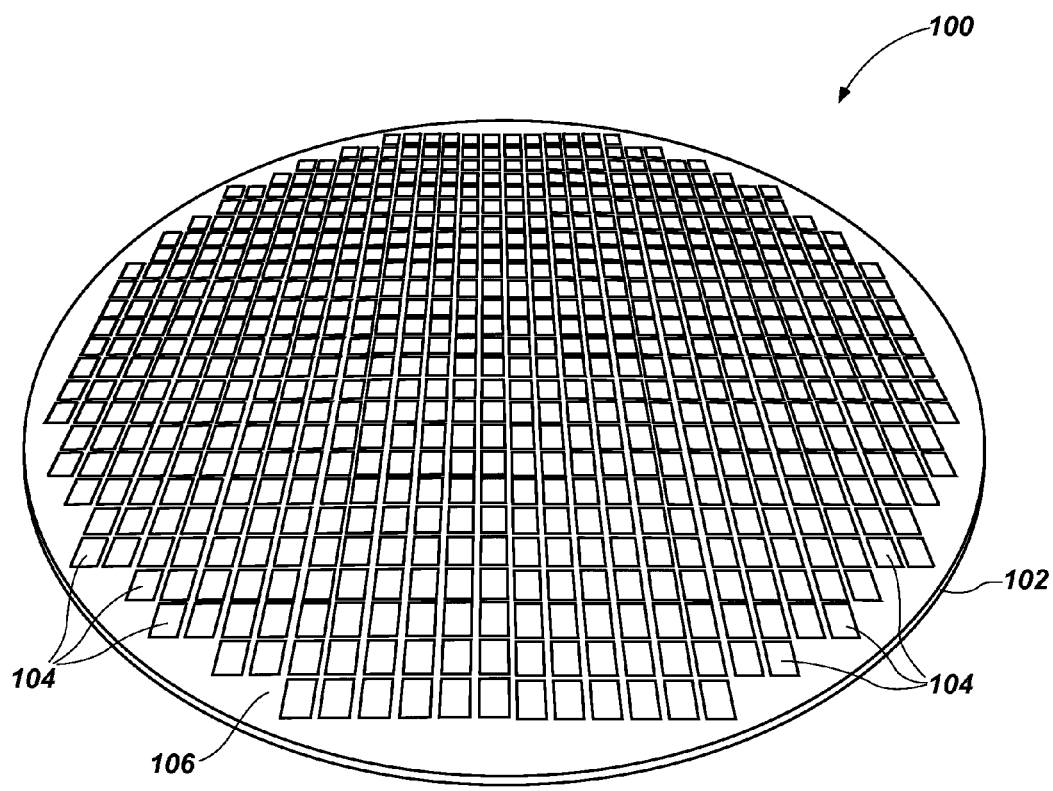
FIG. 1 is a perspective view of a wafer-level assembly.

Referring to FIG. 1, a perspective view of a wafer-level assembly 100 is shown. The wafer-level assembly 100 may include a wafer 102 of semiconductor material (e.g., silicon) to be processed into a plurality of semiconductor devices. The wafer 102 may be of any shape, such as, for example, at least substantially disc-shaped. The wafer-level assembly 100 may include in-process semiconductor devices 104, which may be formed by stacking semiconductor dice 112 (FIG. 2) in laterally spaced relationship over die locations on the active surface of the wafer 102, and electrically and physically connecting the semiconductor dice 112 to one another and to the die locations. A molding material 106 may be positioned on the active surface of the wafer 102 to at least surround the stacked semiconductor dice 112. The molding material 106 may physically support and protect the stacked semiconductor dice 112 and may be a barrier to contaminants (e.g., dust and moisture) that may damage the semiconductor dice 112. As shown in FIG. 1, after the molding material 106 is applied, it may be removed from the tops of the stacked semiconductor dice 112 of in-process semiconductor devices 104.

Figure 2:
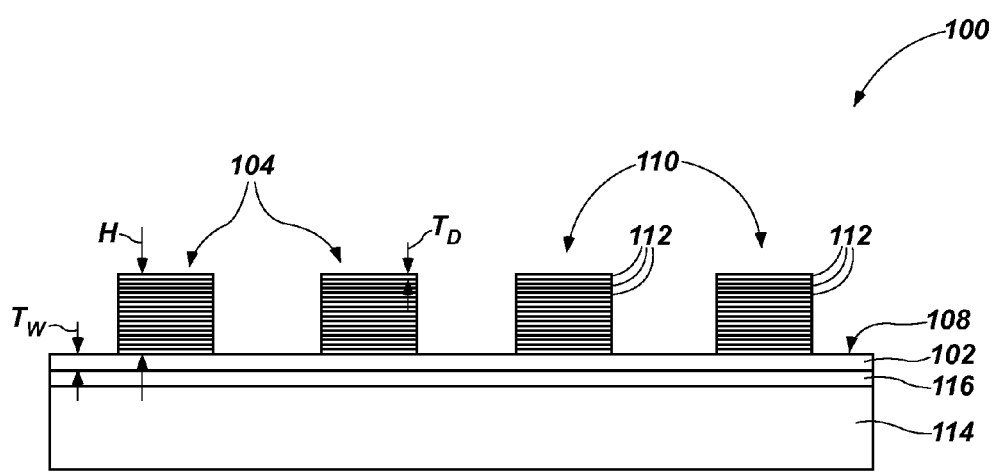
FIG. 2 is a cross-sectional view of a portion of the wafer-level assembly of FIG. 1 in a first state.

FIG. 2 is a cross-sectional view of a portion of the wafer-level assembly 100 of FIG. 1 in a first state. The wafer 102 of the wafer-level assembly 100 may include an active surface 108, which is depicted as the upper surface of the wafer 102 in FIG. 2. The active surface 108 may include, for example, circuitry and bond pads at a large number of die locations configured to connect electrically to additional components to form the semiconductor devices 104. The wafer 102 may be extremely thin, such that the wafer 102 is especially susceptible to warpage. Such thinning may reduce an initial wafer thickness of, for example, 750 microns to less than 100 microns to expose ends of conductive elements in the wafer in the form of so-called "through silicon" vias, on the back side of the wafer, followed by passivation of the back side and formation of contact pads, with or without redistribution circuitry. For example, a thickness $T_W$ of the wafer 102 may be between about 25 microns and about 100 microns. More specifically, the thickness $T_W$ of the wafer 102 may be, for example, between about 35 microns and about 80 microns. As a specific, nonlimiting example, the thickness $T_W$ of the wafer 102 may be between about 45 microns and about 60 microns.

The wafer 102 may be secured to a carrier substrate 114 configured to support the wafer 102 during handling and processing. The carrier substrate 114 may be located on a side of the wafer 102 opposing stacks 110 of semiconductor dice 112 (e.g., on a back side of the wafer 102). The carrier substrate 114 may be of a rigid material, such as, for example, glass or silica, to support the wafer 102, though the wafer-level assembly 100, including the carrier substrate 114, may still be susceptible to warpage. The carrier substrate 114 may be secured to the wafer 102, for example, by an adhesive material 116 located between the carrier substrate 114 and the wafer 102. The adhesive material 116 may remain stable (i.e., may continue to adhere the wafer 102 to the carrier substrate 114) at elevated temperatures, such as, for example, temperatures exceeding 200° C. As specific, nonlimiting examples, the carrier substrate 114 may be secured to the wafer 102 using a WAFERBOND® HT-10.10 or BREWERBOND® 220 thermoplastic material, available from Brewer Science, Inc., of Rolla, Mo., USA; LC3200 or LC5300 temporary bonding material, available from 3M Co. of St. Paul, Minn., USA; three-layer temporary bonding material, available from Shin-Etsu Chemical Co. of Tokyo, Japan; or A4004 and A4007 temporary bonding material, available from TOK Co., Ltd., of Kawasaki, Japan.

Stacks 110 of semiconductor dice 112 may be located on the active surface 108 of the wafer 102. A number of semiconductor dice 112 in each stack 110 may vary, for example, from wafer 102 to wafer 102. The number of semiconductor dice 112 in a given stack 110 may be, for example, from one to sixteen. More specifically, the number of semiconductor dice 112 in a given stack 110 may be, for example, four, eight, twelve, or sixteen. As specific, nonlimiting examples, the number of semiconductor dice 112 in a given stack 110 may be, for example, four or eight.

A thickness $T_D$ of each semiconductor die 112 in the stacks 110 may be, for example, between about 25 microns and about 100 microns. More specifically, the thickness $T_D$ of each semiconductor die 112 may be, for example, between about 35 microns and about 80 microns. As a specific, nonlimiting example, the thickness $T_D$ of each semiconductor die 112 may be between about 45 microns and about 60 microns. In some embodiments, the thickness $T_D$ of each semiconductor die 112 may be at least substantially the same as the thickness $T_W$ of the wafer 102. In other embodiments, the thickness $T_D$ of each semiconductor die 112 may differ from the thickness $T_W$ of the wafer 102. A height H of a given stack 110 (e.g., each stack 110) above the active surface 108 may be, for example, between about 50 microns and about 1.6 mm. More specifically, the height H of a given stack 110 (e.g., each stack 110) above the active surface 108 may be, for example, between about 360 microns in the case of a four-die stack 110 and about 1.44 mm in the case of a sixteen-die stack. As specific, nonlimiting examples, the height H of a given eight-die stack 110 (e.g., each stack 110) above the active surface 108 may be about 720 microns, 740 microns, or 780 microns, depending on die thickness and the space between each die 112, which may be referred to as the bond line thickness.

The semiconductor dice 112 may be electrically connected to one another and to the circuitry of the die locations on the active surface 108 of the wafer 102. In addition, the semiconductor dice 112 may be physically secured to one another and to the wafer 102 to form the stacks 110. For example, the electrical connections and physical securement may be accomplished using thermocompression bonding. More specifically, the electrical connections and physical securement may be effected, for example, one layer of semiconductor dice 112 at a time or collectively for stacks of semiconductor dice 112 using thermocompression bonding of copper pillars of one semiconductor die 112 to copper or nickel pads of an adjacent semiconductor 112 die using, for example, a tin-silver solder, or by direct metal to metal (e.g., copper to copper) thermocompression bonding. During the thermocompression bonding, the wafer-level assembly is exposed to elevated temperatures exceeding about 200° C., such as up to about 260° C. In the case of semiconductor dice 112 which are stacked and bonded layer by layer, exposure to elevated temperatures are repeated, necessitating the use of an adhesive which, as discussed above, will not unduly soften under such temperatures and continue to hold the wafer 102 to carrier substrate 114.

After the stacks of semiconductor dice 112 are connected to wafer 102, a dielectric underfill material, such as a capillary underfill, may be introduced between the stacked semiconductor dice 112 and between the lowermost semiconductor die 112 of each stack 110 and the active surface 108 of wafer 102.

Figure 3:
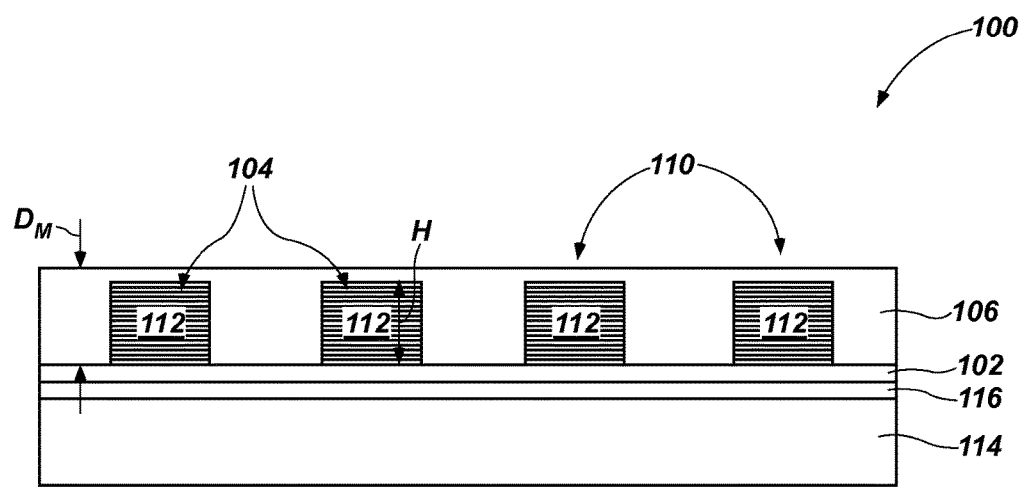
FIG. 3 is a cross-sectional view of the portion of the wafer-level assembly of FIG. 2 in a second state.

FIG. 3 is a cross-sectional view of the portion of the wafer-level assembly 100 of FIG. 2 in a second state. Molding material 106 may be positioned on the active surface 108 (FIG. 2) of the wafer 102 to surround and extend over the stacks 110 of semiconductor dice 112. The molding material 106 may structurally reinforce the stacks 110 of semiconductor dice 112 and may reduce (e.g., eliminate) the likelihood that contaminants (e.g., dust and moisture) will contact the wafer 102 and covered portions of the stacks 110 of semiconductor dice 112. The molding material 106 may be, for example, a curable polymer material. More specifically, the molding material 106 may be molded at low temperature (e.g., less than 150° C.), be cured quickly (e.g., less than 10 minutes), be sufficiently flowable to infiltrate all desired spaces, refrain from excessive flow beyond predetermined boundaries, and exhibit low warp stress. As specific, nonlimiting examples, the molding material 106 may be liquid compound R4502-H1 or R4502-A1, available from Nagase ChemteX Corp. of Osaka, Japan; granular compound X89279, available from Sumitomo Corp. of Tokyo, Japan; powder compound GE-100-PWL2-imp1c from Hitachi Chemical Co., Ltd. of Tokyo, Japan; or sheet compound SINR DF5770M9 or SMC-851 from Shin-Etsu Chemical Co. of Tokyo, Japan.

A depth $D_M$ of the molding material 106 may be, for example, sufficient to at least laterally surround the stacks 110 of semiconductor dice 112. In some embodiments, the molding material 106 may completely surround the stacks 110 of semiconductor dice 112 on all sides other than the side directly facing the wafer 102 and extend over the stacks 110, such that the depth $D_M$ of the molding material 106 is greater than the height H of the stacks 110. In other embodiments, the molding material 106 may surround the stacks 110 of semiconductor dice 112 only at their peripheries, such that the depth $D_M$ of the molding material 106 is at least substantially equal to the height H of the stacks 110.

As previously noted, the molding material 106 may be a significant cause of warpage of the wafer-level assembly 100. For example, differences in coefficients of thermal expansion between the molding material 106 and the other components of the wafer-level assembly 100, such as, for example, the wafer 102 and the carrier substrate 114, may cause the molding material 106 and the other components to expand and contract at different rates and to different degrees when compared to one another. Differences in expansion and contraction rates and degrees may cause the wafer-level assembly 100 to deform, for example, into a concave, convex, or otherwise warped shape exhibiting a lack of planarity within manufacturing tolerances.

Figure 4:
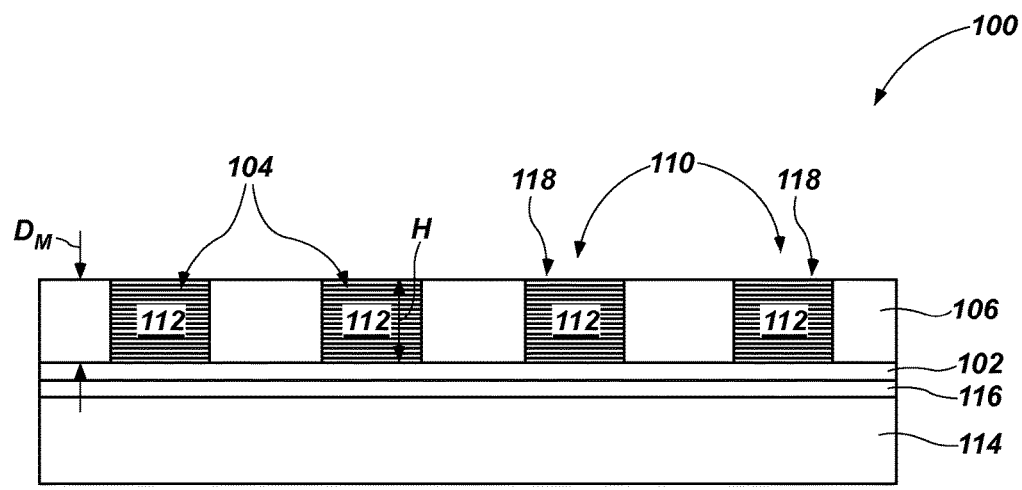
FIG. 4 is a cross-sectional view of the portion of the wafer-level assembly of FIG. 2 in a third state.

FIG. 4 is a cross-sectional view of the portion of the wafer-level assembly 100 of FIG. 2 in a third state. In some embodiments where the depth $D_M$ of the molding material 106 is greater than the height H of the stacks 110 of semiconductor dice 112, a portion of the molding material 106 may be removed to reduce the depth $D_M$ of the molding material 106. For example, the molding material 106 may be subjected to optional grinding and planarization processes (e.g., chemical—mechanical planarization) to reduce the depth $D_M$ of the molding material 106. In some embodiments, upper surfaces 118 of uppermost semiconductor dice 112 of the stacks 110 may be exposed by removing a portion of the molding material 106. Reducing the depth $D_M$ of the molding material 106 may facilitate heat transfer from the stacks 110 of semiconductor dice 112 to, for example, a heat sink element such as a package lid through a thermal interface material (TIM).

Methods of preparing semiconductor devices may involve attaching a wafer to a carrier substrate with an adhesive comprising a thermoplastic material. Semiconductor die stacks may be formed over die locations on the wafer on a side of the wafer opposite the carrier. Molding material may be disposed over the die stacks and in streets between the die stacks on the wafer. Grooves may be formed in the streets by partially cutting through the molding material.

Figure 5:
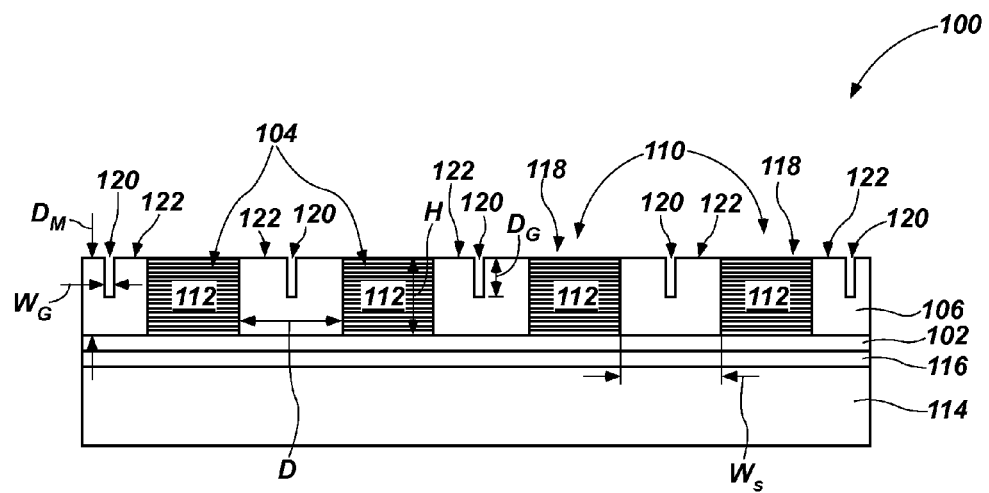
FIG. 5 is a cross-sectional view of the portion of the wafer-level assembly of FIG. 2 in a fourth state.

FIG. 5 is a cross-sectional view of the portion of the wafer-level assembly 100 of FIG. 2 in a fourth state. Grooves 120 (e.g., channels), which may also be characterized as kerfs, may be formed in the molding material 106 to reduce warpage of the wafer-level assembly 100. For example, the molding material 106 may expand into the grooves 120 under elevated temperatures encountered during back side processing of the wafer-level assembly 100, and a width $W_G$ of the grooves 120 may increase in response to contraction of the molding material 106 upon cooling of the wafer-level assembly 100, such that expansion and contraction of the molding material 106 warps the wafer-level assembly 100 to a significantly lesser degree. For example, the grooves 120 may be formed in at least some streets 122 between adjacent stacks 110 of semiconductor dice 112, and in mutually perpendicular directions across wafer 102. Stated another way, grooves 120 introduce effective discontinuities in molding material 106 at laterally spaced intervals across wafer-level assembly 100, reducing the effective depth of molding material 106, which may otherwise tend to cause warpage of wafer-level assembly 100 under temperature variations.

A depth $D_G$ of the grooves 120 may be, for example, between about 25% and about 75% of the height H of at least one of the stacks 110. More specifically, the depth $D_G$ of the grooves 120 may be, for example, between about 40% and about 60% of the height H of at least one of the stacks 110. As a specific, nonlimiting example, the depth $D_G$ of the grooves 120 may be about 50% of the height H of the stacks 110. In some embodiments, the depth $D_G$ of the grooves 120 may be, for example, between about 20% and about 80% of the depth $D_M$ of the molding material 106. More specifically, the depth $D_G$ of the grooves 120 may be, for example, between about 35% and about 65% of the depth $D_M$ of the molding material 106. As a specific, nonlimiting example, the depth $D_G$ of the grooves 120 may be about 50% of the depth $D_M$ of the molding material 106. The width $W_G$ of the grooves 120 may be, for example, between about 3% and about 25% of a width $W_S$ of the street 122 between adjacent stacks 110 of semiconductor dice 112. More specifically, the width $W_G$ of the grooves 120 may be, for example, between about 5% and about 15% of a distance D between adjacent stacks 110 of semiconductor dice 112. As a specific, nonlimiting example, the width $W_G$ of the grooves 120 may be about 10% of the width $W_S$ of the street 122 between adjacent stacks 110 of semiconductor dice 112. The width $W_G$ of the grooves 120 may be, for example, between about 50 microns and about 200 microns. More specifically, the width $W_G$ of the grooves 120 may be, for example, between about 75 microns and about 175 microns. As a specific, nonlimiting example, the width $W_G$ of the grooves 120 may be between about 100 microns and about 150 microns.

Determining the appropriate size, cross-sectional shape, positioning, and quantity of the grooves 120 for a given size, shape, and material composition for the wafer-level assembly 100 may be aided by computer modeling. For example, finite element analysis software commercially available from ANSYS® may be used to model various depths, widths, patterns, and configurations of the grooves 120 and their effect on warpage of the wafer-level assembly 100. More specifically, the grooves 120 and their effect on warpage may be modeled using techniques at least substantially similar to those described in Aditi Mallik and Roger Stout, *Simulation of Process-Stress Induced Warpage of Silicon Wafers Using ANSYS® Finite Element Analysis*, on the World Wide Web at onsemi.com/site/pdf/IMAPS-wafer-warpage_aditi_roger.pdf (last visited Apr. 10, 2014).

Methods of processing semiconductor devices may involve forming grooves partially through a molding material, the molding material located in streets of a wafer-level assembly comprising laterally separated stacks of semiconductor dice on a wafer.

Figure 6:
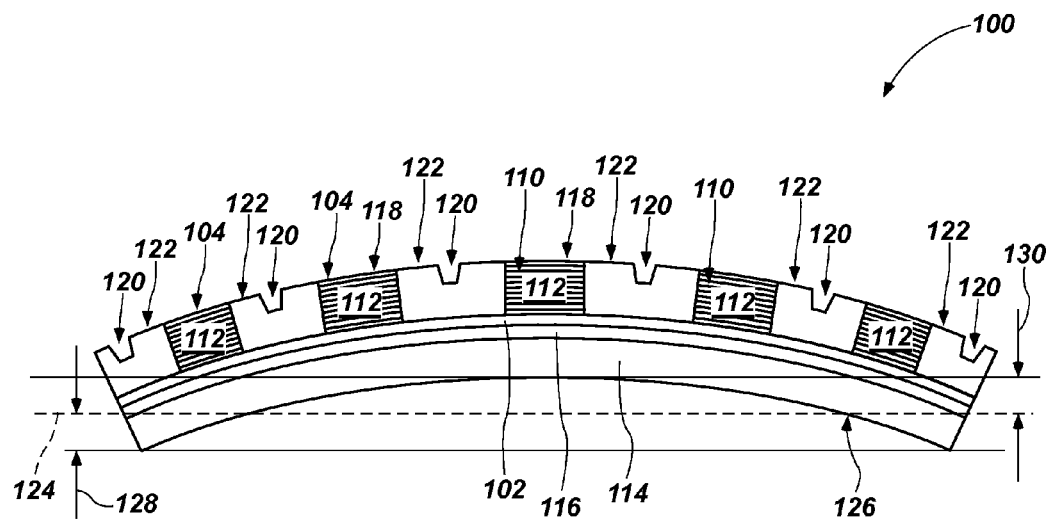
FIG. 6 is a cross-sectional view of the portion of the wafer-level assembly of FIG. 2 in a fifth state.

FIG. 6 is a cross-sectional view of the portion of the wafer-level assembly 100 of FIG. 2 in a fifth state. When the wafer-level assembly 100 is heated or cooled during processing and handling, the wafer-level assembly 100 may warp. For example, when the wafer-level assembly 100 is exposed to an elevated temperature, the wafer-level assembly 100 may exhibit a convex shape, as shown in FIG. 6. The actual warpage shown in FIG. 6 may be exaggerated for clarity in description.

Warpage of the wafer-level assembly 100 may be measured, for example, with respect to a reference plane 124. The reference plane 124 may be generated by performing a least-squares fit of a warped surface of the wafer-level assembly 100, such as, for example, the active surface 108 (FIG. 2) of the wafer 102 or a bottom surface 126 of the wafer-level assembly 100 defined by the carrier substrate 114, as shown in FIG. 6. The warpage of the wafer-level assembly 100 and its components, such as, for example, the wafer 102, may be calculated by adding a largest negative displacement 128 of the surface with respect to which the reference plane 124 was generated (e.g., the bottom surface 126) from the reference plane 124 to a largest positive displacement 130 of the surface with respect to which the reference plane 124 was generated (e.g., the bottom surface 126) from the reference plane 124. As a specific, nonlimiting example, the warpage may be measured using the techniques described in Nakajima et al., *Measurement Methods of Package Warpage at Elevated Temperature and the Maximum Permissible Warpage*, on the World Wide Web at akrometrix.com/industrydocs/JEITA_Warpage_Specification_2007.pdf (last visited Apr. 10, 2014).

Wafer-level assemblies may include a wafer comprising die locations thereon laterally separated by streets. A stack of semiconductor dice may be positioned on each of at least some die locations, and a molding material may be located within the streets and may at least surround the stacks of semiconductor dice. Kerfs may extend from an upper surface of the molding material partially through a depth of the molding material.

Figure 7:
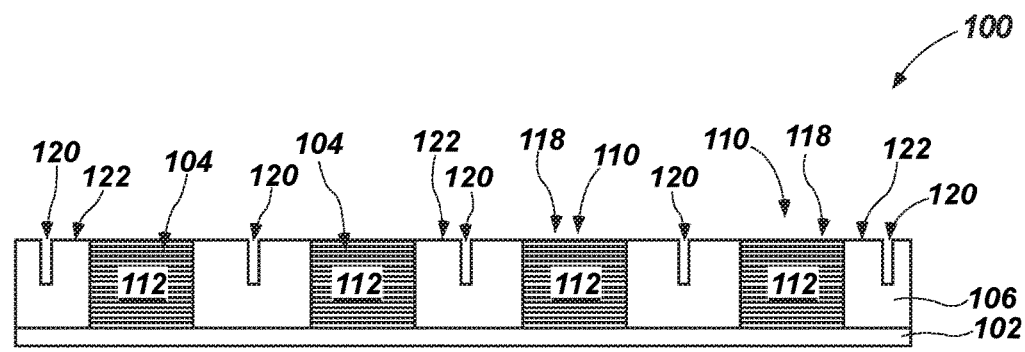
FIG. 7 is a cross-sectional view of the portion of the wafer-level assembly of FIG. 2 in a sixth state.

FIG. 7 is a cross-sectional view of the portion of the wafer-level assembly 100 of FIG. 2 in a sixth state. The carrier substrate 114 (see FIGS. 2-6) and adhesive material 116 (see FIGS. 2-6) may be removed from the wafer-level assembly 100. For example, the adhesive material 116 (see FIGS. 2-6) may be heated to a temperature at which the adhesive material 116 softens and the wafer 102 and the carrier substrate 114 may be moved laterally with respect to one another in a process termed "slide" debonding to detach the carrier substrate 114 from the wafer 102. More specifically, the wafer-level assembly 100 may be exposed to a temperature greater than, for example, 200° C., and the carrier substrate 114 may be detached from the wafer-level assembly 100. If the wafer-level assembly 100 warps significantly during heating, removal of the carrier substrate 114 may damage the wafer 102, which may render semiconductor devices 104 to be obtained from the wafer-level assembly 100 inoperable. The grooves 120 may maintain warpage of the wafer-level assembly 100 within acceptable tolerances. For example, the grooves 120 may maintain warpage of the wafer-level assembly 100 and its components, such as, for example, the wafer 102, about 25 times greater than the thickness $T_W$ of the wafer 102 or less. More specifically, the grooves 120 may maintain warpage of the wafer-level assembly 100 and its components, such as, for example, the wafer 102, between about 5 times and about 20 times greater than the thickness $T_W$ of the wafer 102. As a specific, nonlimiting example, the grooves 120 may maintain warpage of the wafer-level assembly 100 and its components, such as, for example, the wafer 102, between about 6 times and about 15 times greater than the thickness $T_W$ of the wafer 102. As another example, the grooves 120 may maintain warpage of the wafer-level assembly 100 and its components, such as, for example, the wafer 102, about 1.0 mm or less. More specifically, the grooves 120 may maintain warpage of the wafer-level assembly 100 and its components, such as, for example, the wafer 102, about 0.75 mm or less.

Figure 8:
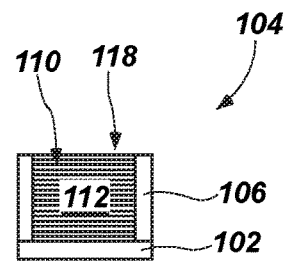
FIG. 8 is a cross-sectional view of a semiconductor device from the wafer-level assembly of FIG. 2.

FIG. 8 is a cross-sectional view of a semiconductor device 104 from the wafer-level assembly 100 of FIG. 7. The wafer-level assembly 100 (see FIGS. 2-7) may be permitted to cool to room temperature (e.g., about 21° C.). Semiconductor devices 104 may be formed from the wafer-level assembly 100 (see FIGS. 2-7) by cutting entirely through the molding material 106 and wafer 102 along the streets 122 (see FIGS. 5-7) and through the previously cut kerfs to separate individual semiconductor devices 104 from one another using a diamond dicing saw blade of lesser width than that of a blade used to form the kerfs to reduce (e.g., eliminate) the likelihood that the saw blade will bind against a side of the previously cut molding material 106.

Examples

Figure 9:
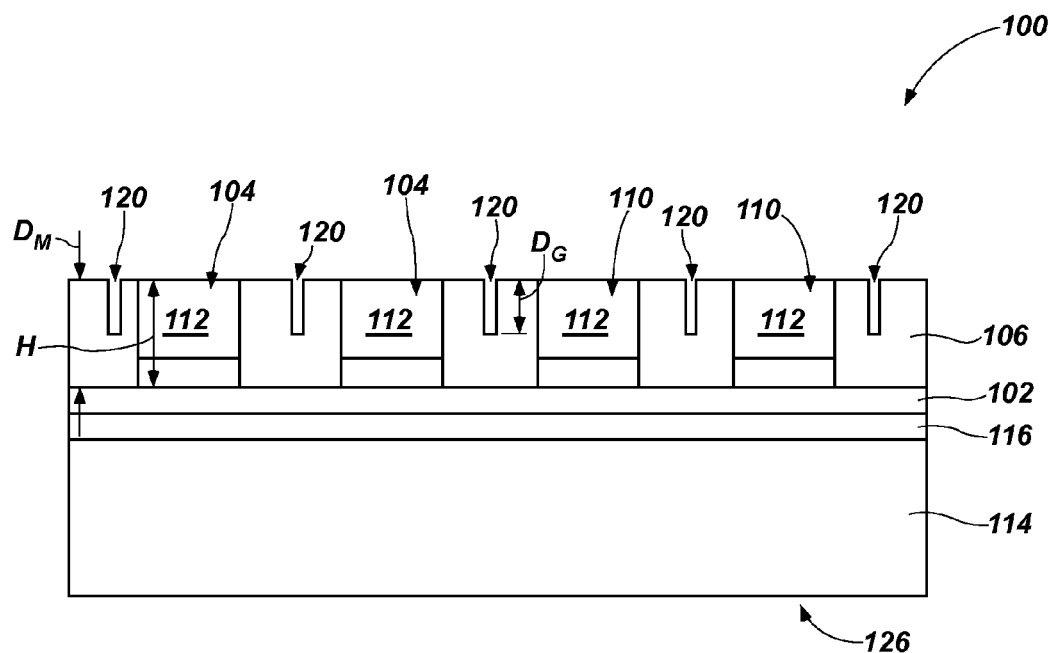
FIG. 9 is a cross-sectional view of a portion of one embodiment of a wafer-level assembly similar to that shown in FIGS. 5 and 6.

FIG. 9 is a cross-sectional view of a portion of one embodiment of a wafer-level assembly 100 in the fourth state, similar to that shown in FIGS. 5 and 6. The depth $D_M$ of the molding material 106 was about 0.74 mm, and the depth $D_G$ of the grooves 120 was about 0.4 mm. The height H of the stacks 110 was equal to the depth $D_M$ of the molding material 106. The wafer-level assembly 100 was exposed to temperatures from room temperature to over 200° C. and permitted to cool to room temperature again. Warpage of the wafer-level assembly 100 was measured using the shadow moiré method, which involves measuring the size of shadows cast by a grid of known size and shape using a light source of known positioning on the surface (e.g., bottom surface 126) of the wafer-level assembly 100. Additional details regarding the shadow moiré method for measuring warpage are disclosed in Yinyan Wang and Patrick Hassell, *Measurement of Thermally Induced Warpage of BGA Packages/Substrates Using Phase-Stepping Shadow Moiré*, on the World Wide Web at akrometrix.com/whitepapers/BGA%20Warpage%20Using%20Phase%20Stepping.pdf (last visited Apr. 10, 2014).

Figure 10:
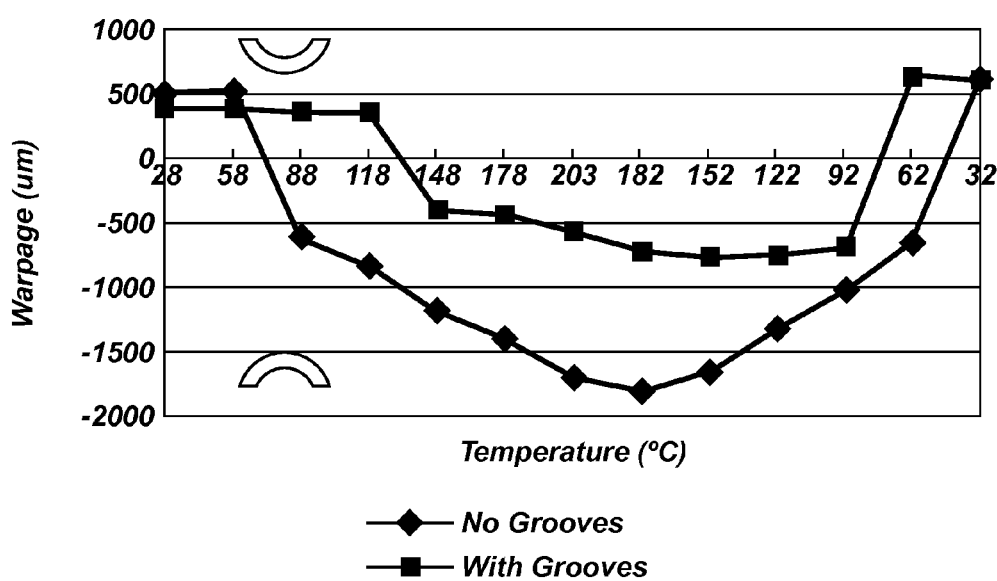
FIG. 10 is a comparison of warpage of the wafer-level assembly of FIG. 9 to warpage of a similarly configured wafer-level assembly lacking grooves.

FIG. 10 is a comparison of warpage of the wafer-level assembly of FIG. 9 to warpage of a similarly configured wafer-level assembly lacking grooves. While initial and final concave warpage exhibited by the two wafer-level assemblies was similar, the convex warpage of the wafer-level assembly including grooves at peak temperature was less than half the convex warpage of the wafer-level assembly lacking grooves. More specifically, the wafer-level assembly including grooves warped by about 0.75 mm, while the wafer-level assembly lacking grooves warped by about 1.8 mm.

Figure 11:
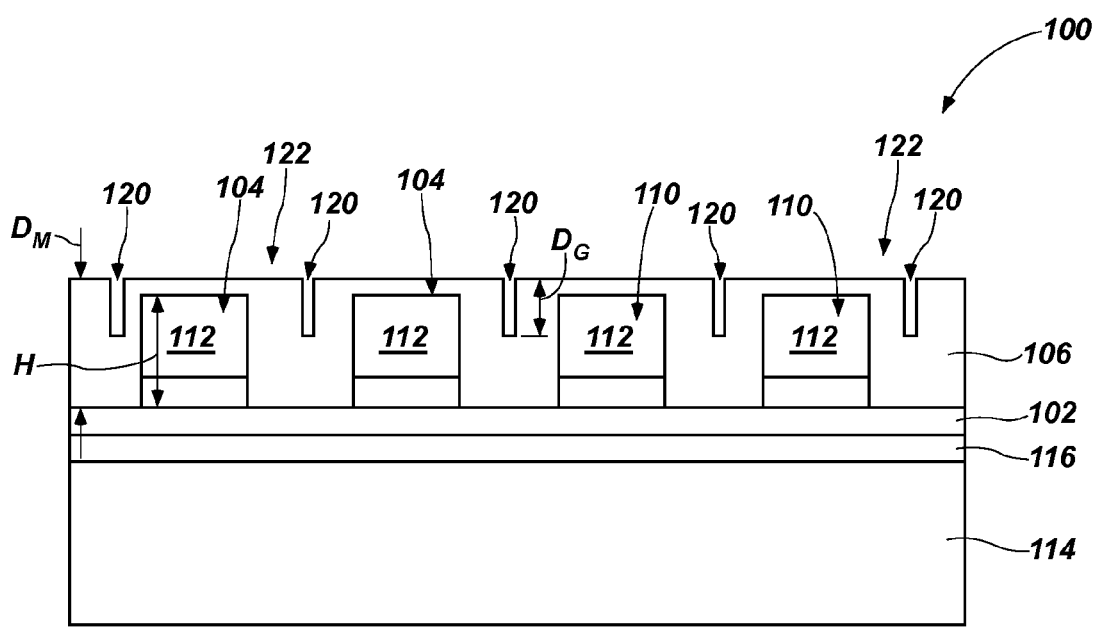
FIG. 11 is a cross-sectional view of a portion of another embodiment of a wafer-level assembly in the fourth state.

FIG. 11 is a cross-sectional view of a portion of another embodiment of a wafer-level assembly in the fourth state. The depth $D_M$ of the molding material 106 was about 0.85 mm, and the depth $D_G$ of the grooves 120 was about 0.4 mm. The height H of the stacks 110 was less than the depth $D_M$ of the molding material 106. The wafer-level assembly 100 was exposed to temperatures from room temperature to over 200° C. and permitted to cool to room temperature again. Warpage of the wafer-level assembly 100 was measured using the shadow moiré method, which involves measuring the size of shadows cast by a grid of known size and shape using a light source of known positioning on the surface (e.g., bottom surface 126) of the wafer-level assembly 100 using the same techniques described in connection with FIG. 9.

Figure 12:
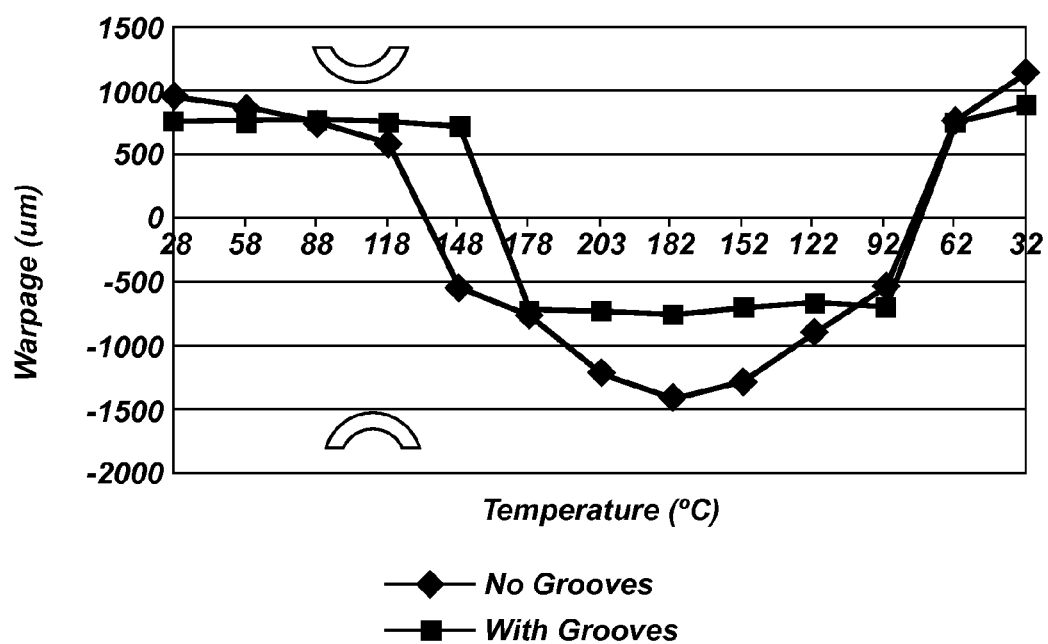
FIG. 12 is a comparison of warpage of the wafer-level assembly of FIG. 11 to warpage of a similarly configured wafer-level assembly lacking grooves.

FIG. 12 is a comparison of warpage of the wafer-level assembly of FIG. 11 to warpage of a similarly configured wafer-level assembly lacking grooves. While initial and final concave warpage of the wafer-level assemblies was similar, the convex warpage of the wafer-level assembly including grooves at peak temperature was about half the convex warpage of the wafer-level assembly lacking grooves. More specifically, the wafer-level assembly including grooves warped by about 0.74 mm, while the wafer-level assembly lacking grooves warped by about 1.4 mm.

While certain illustrative embodiments have been described in connection with the figures, those of ordinary skill in the art will recognize and appreciate that the scope of this disclosure is not limited to those embodiments explicitly shown and described in this disclosure. Rather, many additions, deletions, and modifications to the embodiments described in this disclosure may result in embodiments within the scope of this disclosure, such as those specifically claimed, including legal equivalents. In addition, features from one disclosed embodiment may be combined with features of another disclosed embodiment while still being within the scope of this disclosure, as contemplated by the inventors.

What is claimed is:

1. A method of processing semiconductor devices, comprising:
   forming grooves partially through a molding material, the molding material located in streets of a wafer-level assembly comprising laterally separated stacks of semiconductor dice on a wafer, a carrier substrate supporting the wafer on a side of the wafer opposite the stacks of semiconductor dice;
   heating the wafer-level assembly while the grooves remain unoccupied; and
   detaching the carrier substrate from the wafer while heating the wafer-level assembly.

2. The method of claim 1, wherein heating the wafer-level assembly comprises heating the wafer-level assembly to a temperature in excess of 200° C. while maintaining warpage of the wafer-level assembly to no more than about 1 mm as determined by adding a largest positive displacement of a surface of the wafer-level assembly and a largest negative displacement of the surface of the wafer-level assembly with respect to a plane defined by a least-squares fit of the surface of the wafer-level assembly.

3. The method of claim 1, wherein heating the wafer-level assembly comprises heating the wafer-level assembly to a temperature in excess of 200° C. while maintaining the warpage of the wafer to no more than about 0.75 mm as determined by adding a largest positive displacement of a surface of the wafer-level assembly and a largest negative displacement of the surface of the wafer-level assembly with respect to a plane defined by the least-squares fit of the surface of the wafer-level assembly.

4. The method of claim 1, wherein forming the grooves comprises forming the grooves to a depth of between about 20% to about 80% of a height of the molding material above the wafer.

5. The method of claim 1, wherein forming the grooves comprises forming the grooves to a depth of about 50% of a height of the molding material above the wafer.

6. The method of claim 1, wherein forming the grooves comprises forming the grooves to a depth of between about 25% to about 75% of a height of the stacks of semiconductor dice above the wafer.

7. The method of claim 1, wherein forming the grooves comprises forming the grooves to a depth of about 50% of a height of the stacks of semiconductor dice above the wafer.

8. The method of claim 1, wherein heating the wafer-level assembly comprises heating the wafer-level assembly to a temperature of 200° C. or higher to detach the carrier substrate from the wafer.

9. The method of claim 1, further comprising disposing the molding material over the stacks of semiconductor dice and in the streets before forming the grooves.

10. The method of claim 1, further comprising removing the molding material over the stacks of semiconductor dice to expose tops of the stacks before forming the grooves.

11. The method of claim 1, wherein heating the wafer-level assembly comprises heating the wafer-level assembly to a temperature of 200° C. or higher, and further comprising permitting the wafer-level assembly to cool to room temperature and cutting through the molding material and wafer along the streets and where grooves exist, coincident with the grooves, to separate individual stacks of semiconductor dice from one another.

12. The method of claim 11, wherein cutting through the molding material and wafer along the streets comprises cutting a narrower width than a width of the grooves.

13. The method of claim 1, wherein forming the grooves comprises forming the grooves in fewer than all streets.

14. The method of claim 1, wherein forming the grooves comprises forming the grooves corresponding to at least substantially all streets.

15. A wafer-level method of preparing semiconductor devices, comprising:
   attaching a wafer to a carrier substrate with an adhesive comprising a thermoplastic material;
   forming semiconductor die stacks over die locations on the wafer on a side of the wafer opposite the carrier;
   disposing molding material over the die stacks and in streets between the die stacks on the wafer;
   partially cutting through the molding material to form grooves in the streets;
   exposing the wafer, die stacks, and molding material to an elevated temperature while the grooves remain free of occupying material; and
   detaching the carrier substrate from the wafer while exposing the wafer, die stacks, and molding material to the elevated temperature.

16. The method of claim 15, wherein exposing the wafer, die stacks, and molding material to the elevated temperature comprises exposing the wafer, die stacks, and molding material to a temperature of 200° C. or higher to soften the thermoplastic material.

17. The method of claim 15, further comprising, at a temperature of about 200° C., maintaining a warpage of the wafer to about 1 mm or less as measured by adding a largest positive displacement of a surface of the wafer-level assembly and a largest negative displacement of the surface of the wafer-level assembly with respect to a plane defined by a least-squares fit of the surface of the wafer-level assembly.

18. The method of claim 15, further comprising, at a temperature of about 200° C., maintaining a warpage of the wafer to about 0.75 mm or less as measured by adding a largest positive displacement of a surface of the wafer-level assembly and a largest negative displacement of the surface of the wafer-level assembly with respect to a plane defined by a least-squares fit of the surface of the wafer-level assembly.

19. The method of claim 15, wherein forming the grooves in the streets defined by the molding material comprises forming the grooves to a depth of between about 25% to about 75% of a height of the die stacks above the wafer.

20. The method of claim 15, wherein forming the grooves in the streets defined by the molding material comprises forming the grooves to a depth of between about 20% to about 80% of a height of the molding material above the wafer.

* * * * *